(12) United States Patent
Kim et al.

(10) Patent No.: US 10,141,292 B2
(45) Date of Patent: Nov. 27, 2018

(54) DRIVING CHIP BUMP HAVING IRREGULAR SURFACE PROFILE, DISPLAY PANEL CONNECTED THERETO AND DISPLAY DEVICE INCLUDING THE SAME

(71) Applicant: SAMSUNG DISPLAY CO., LTD., Yongin-si, Gyeonggi-do (KR)

(72) Inventors: Byoungyong Kim, Seoul (KR); Jonghyuk Lee, Seoul (KR); Jeongho Hwang, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/702,818

(22) Filed: Sep. 13, 2017

(65) Prior Publication Data

US 2018/0108643 A1    Apr. 19, 2018

(30) Foreign Application Priority Data

Oct. 13, 2016  (KR) .......................... 10-2016-0132883

(51) Int. Cl.

| | |
|---|---|
| *H01L 23/48* | (2006.01) |
| *H01L 23/52* | (2006.01) |
| *H01L 29/40* | (2006.01) |
| *H01L 25/18* | (2006.01) |
| *H01L 23/00* | (2006.01) |

(52) U.S. Cl.
CPC .............. *H01L 25/18* (2013.01); *H01L 24/08* (2013.01); *H01L 24/17* (2013.01); *H01L 2224/16245* (2013.01); *H01L 2924/14* (2013.01)

(58) Field of Classification Search
CPC ....... H01L 41/053; H01L 24/16; H01L 24/08; H01L 2224/8085; H01L 2224/8185
See application file for complete search history.

(56) References Cited

U.S. PATENT DOCUMENTS

| 5,861,661 A * | 1/1999 | Tang ......................... C09J 9/02 |
| | | 257/668 |
| 7,755,261 B2 * | 7/2010 | Hashimoto .......... H03H 9/0519 |
| | | 310/370 |
| 8,342,859 B2 * | 1/2013 | Hashimoto .......... H03H 9/1021 |
| | | 439/66 |
| 2005/0062153 A1 * | 3/2005 | Saito ................. H01L 23/49816 |
| | | 257/737 |

(Continued)

FOREIGN PATENT DOCUMENTS

KR            100892720 B1      4/2009

*Primary Examiner* — Jaehwan Oh
*Assistant Examiner* — John M Parker
(74) *Attorney, Agent, or Firm* — Cantor Colburn LLP

(57) ABSTRACT

A display device includes: a display panel driven to display an image, the display panel including a substrate including a display area at which the image is displayed; a terminal pad on the substrate and through which a driving signal is applied to the display area; a driving chip through which the driving signal is applied to the terminal pad; and a non-conductive film which fixes the driving chip to the substrate. The driving chip includes: a non-conductive elastic support body projected from a surface of the driving chip; a bump wiring on the non-conductive elastic support body, the bump wiring directly contacting the terminal pad to apply the driving signal to the terminal pad; and a dispersed particle on the non-conductive elastic support body.

19 Claims, 14 Drawing Sheets

(56) References Cited

U.S. PATENT DOCUMENTS

| | | | |
|---|---|---|---|
| 2005/0104210 A1 | 5/2005 | Farnworth et al. | |
| 2006/0286790 A1* | 12/2006 | Yamasaki | H01L 24/11 |
| | | | 438/612 |
| 2007/0029671 A1* | 2/2007 | Yamasaki | H01L 21/563 |
| | | | 257/737 |
| 2007/0284758 A1 | 12/2007 | Zhang et al. | |
| 2008/0284011 A1 | 11/2008 | Chang et al. | |
| 2009/0200686 A1 | 8/2009 | Tsang et al. | |
| 2010/0163869 A1 | 7/2010 | Yang et al. | |
| 2010/0295177 A1* | 11/2010 | Ouchi | H01L 23/49811 |
| | | | 257/737 |
| 2011/0115076 A1* | 5/2011 | Yamasaki | H01L 23/3114 |
| | | | 257/737 |

* cited by examiner

DRIVING CHIP BUMP HAVING IRREGULAR SURFACE PROFILE, DISPLAY PANEL CONNECTED THERETO AND DISPLAY DEVICE INCLUDING THE SAME

This application claims priority to Korean Patent Application No. 10-2016-0132883, filed on Oct. 13, 2016, and all the benefits accruing therefrom under 35 U.S.C. § 119, the content of which in its entirety is herein incorporated by reference.

BACKGROUND

1. Field

Exemplary embodiments of the invention relate to a driving chip mounted in a high-resolution flat panel display device, and more particularly, to a driving chip including a polymer bump to facilitate an indentation test and to a display device including a display panel and the driving chip which is connected to the display panel.

2. Description of the Related Art

In general, flat panel display devices are developed into, for example, a liquid crystal display ("LCD") device, a plasma display panel ("PDP") device, an organic light emitting diode ("OLED") display device and the like. Such examples of the flat panel display devices include an image display panel, a driving chip and a circuit board. In such a product, in order to mount the driving chip to be electrically connected to an electrode of the image display panel, an anisotropic conductive film is used.

SUMMARY

Exemplary embodiments of the invention may be directed to a display panel including a driving chip connected thereto, the driving chip having an elastic bump structure in which an input/output bump of the driving chip and a terminal pad of a substrate of the display panel are in direct contact with each other and the contact state may be identified based on an indentation.

According to an exemplary embodiment, a display device including: a display panel driven to display an image, the display panel including a substrate, the substrate including a display area at which the image is displayed; a terminal pad on the substrate and through which a driving signal is applied to the display area; a driving chip through which the driving signal is applied to the terminal pad; and a non-conductive film which fixes the driving chip to the substrate. The driving chip includes: a non-conductive elastic support body projected from a surface of the driving chip; a bump wiring on the elastic support body, the bump wiring directly contacting the terminal pad to apply the driving signal to the terminal pad; and a dispersed particle on the non-conductive elastic support body.

The non-conductive film may be between the driving chip and the substrate, the non-conductive film including a thermocurable resin.

The dispersed particle may have at least one shape of: a spherical shape, a triangular pyramid shape, a hexahedral shape, a cylindrical shape and a polyhedral shape.

The dispersed particle may have a particle diameter less than a height of the projection of the non-conductive elastic support body.

The particle diameter of the dispersed particle may be in a range of about 1 micrometer (μm) to about 5 μm.

The dispersed particle may be between the non-conductive elastic support body and a portion of the bump wiring.

The terminal pad may have a concave portion at which the portion of the bump wiring directly contacts the terminal pad, and a shape of the concave portion corresponds to a shape of the portion of the bump wiring at the dispersed particle.

The driving chip may further include a driving circuit to which the portion of the bump wiring may be connected.

The dispersed particle may be between the non-conductive elastic support body and a portion of the bump wiring.

The dispersed particle may be provided in plurality and is be further between the non-conductive film and a portion of the driving chip exposed from the bump wiring.

A length extension direction of the elastic support body and a length extension direction of the bump wiring may intersect each other.

The bump wiring may be provided in plurality on one non-conductive elastic support body, and the length extension direction of each of the bump wirings intersects the length extension direction of the one non-conductive elastic support body.

According to an exemplary embodiment, a display device includes: a display panel driven to display an image, the display panel including a substrate including a display area at which the image is displayed; a terminal pad on the substrate and through which a driving signal is applied to the display area; a driving chip through which the driving signal is applied to the terminal pad; and a non-conductive film which fixes the driving chip to the substrate. The driving chip includes: a bump provided in plurality arranged on a rear surface portion of the driving chip in a row direction and in a column direction which crosses the row direction. The bump includes: an elastic support body provided in plurality each lengthwise extending in a first direction; a bump wiring provided in plurality each lengthwise extending in a second direction which intersects the first direction, the bump wiring disposed on the elastic support body; and a dispersed particle on the elastic support body.

The plurality of bumps may be arranged in a matrix.

The plurality of bumps may be arranged in a zigzag manner along the row direction or the column direction.

The plurality of bumps may include a first bump including a plurality of bump wirings on a first elastic support body, and a second bump including a plurality of bump wirings on a second elastic support body different from the first elastic support body, the number of the bump wirings of the second bump being different from the number of the bump wirings of the first bump.

The first bump and the second bump may be disposed adjacent to one another in the row direction or the column direction.

The dispersed particle may have a particle diameter less than a height of the elastic support body.

The dispersed particle may be between the elastic support body and a portion of the bump wiring.

The portion of the bump wiring at the dispersed particle may protrude further from the elastic support body than a remainder of the bump wiring.

The foregoing is illustrative only and is not intended to be in any way limiting. In addition to the illustrative exemplary embodiments and features described above, further exemplary embodiments and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, where.

DETAILED DESCRIPTION

Figure 1:
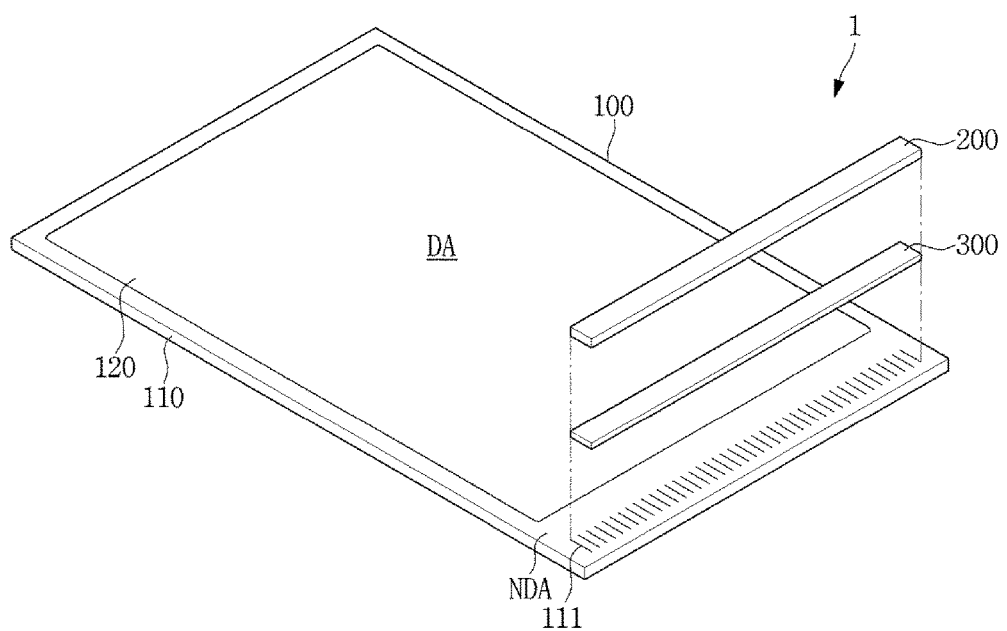
FIG. 1 is a perspective view illustrating a display panel relative to a driving chip according to the prior art.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or plate is referred to as being related to another element such as being "on" another layer, area, or plate, it may be directly on the other layer, area, or plate, or intervening layers, areas, or plates may be present therebetween. Conversely, when a layer, area, or plate is referred to as being related to another element such as being "directly on" another layer, area, or plate, intervening layers, areas, or plates may be absent therebetween. Further when a layer, area, or plate is referred to as being related to another elements such as being "below" another layer, area, or plate, it may be directly below the other layer, area, or plate, or intervening layers, areas, or plates may be present therebetween. Conversely, when a layer, area, or plate is referred to as being related to another element such as being "directly below" another layer, area, or plate, intervening layers, areas, or plates may be absent therebetween.

The spatially relative terms "below," "beneath," "less," "above," "upper," and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being related to another element such as being "connected" to another element, the element is "directly connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the invention, and like reference numerals refer to like elements throughout the specification.

With the trend of high integration and light weight in a chip package, a method of mounting a driving chip within display devices to transmit a signal to an image display panel thereof is developed into a chip on glass ("COG") method, a tape automated bonding method in which the driving chip is mounted using a tape carrier package ("TCP"), or the like. In addition, with the trend of miniaturization of an electrode or conductive wiring pitch in the chip package, the conventional method of using soldering is difficult to manage such that an anisotropic conductive film is largely used as a means for replacing the soldering.

However, as display devices are developed to have relatively high resolution and a substantially minimized non-display area, a width of a conductive wiring decreases and the interval between the wirings becomes narrower. Accordingly, there are difficulties in stably aligning and attaching conductive wirings such as represented by a conductive pad of a substrate, and a bump of a driving chip or a driver integrated circuit ("IC") by using the anisotropic conductive film and disposing conductive particles dispersed in the anisotropic conductive film between the conductive pad and the bump.

FIG. 1 is a perspective view illustrating a conventional display device 1 including a display panel 100, and more particularly, illustrates a relative state of the display panel 100 with respect to a driving chip 200 which is connectable to the display panel 100. The display panel 100 generates and displays an image such as with light. The structure and components that form the display panel 100 are not particularly limited. The display panel 100 may have the structure and components consistent with use within any of a number of display devices, for example, a liquid crystal display ("LCD") device, a plasma display panel ("PDP") device, an organic light emitting diode ("OLED") display device and the like.

Referring to FIG. 1, the display panel 100 is divided into a display area DA in which an image is formed and displayed, and a non-display area NDA which is outside the display area DA and in which the image is not displayed. The non-display area NDA is at the periphery of the display area DA and at an edge area of the display panel 100. A gate pad unit and a data pad unit may be disposed or formed in the non-display area NDA. The gate pad unit and the data pad unit may be disposed or formed in different areas of the non-display area NDA, or may be formed in one area as illustrated in FIG. 1.

In the description with respect to FIG. 1, the gate pad unit and the data pad unit are collectively referred to as a terminal pad unit 111 for conciseness. The terminal pad unit 111 may be connected to the driving chip 200 and to the display panel 100. The terminal pad unit 111 may be considered a component of the display panel 100, but the invention is not limited thereto. The driving chip 200 is a data driver integrated circuit ("IC") and applies a gate signal or a data signal to a gate line (not illustrated) or a data line (not illustrated) of the display panel 100 to control or drive the display panel 100 to form and/or display the image. The terminal pad unit 111 transmits an output signal of the driving chip 200 to the gate line (not illustrated) or the data line (not illustrated) of the display panel 100. Portions of the gate line and the data line may be disposed in the display area DA of the display panel 100. Although not explicitly shown in FIG. 1, the terminal pad unit 111 may be connected to the gate line and the data line in the display area DA. The terminal pad unit 111 may be disposed at terminal ends of the gate line or the data line which extend from the display area DA to the non-display area NDA, but the invention is not limited thereto. In an exemplary embodiment, the gate line and the data line may be disposed in pixels of the display area DA at which the image is generated and displayed.

The terminal pad unit 111 is directly connected to an output bump of the driving chip 200 and a non-conductive film 300 fixes a position of the driving chip 200 so that the driving chip 200 may not be separated from a lower display substrate 110 of the display panel 100 on which the terminal pad unit 111 is disposed or formed. The display panel 100 may further include an upper display substrate 120 which faces the lower display substrate 110. Edge portions of the lower display substrate 110 may be exposed by the upper display substrate 120, such as at an area in which the terminal pad unit 111 is disposed.

Figure 2:
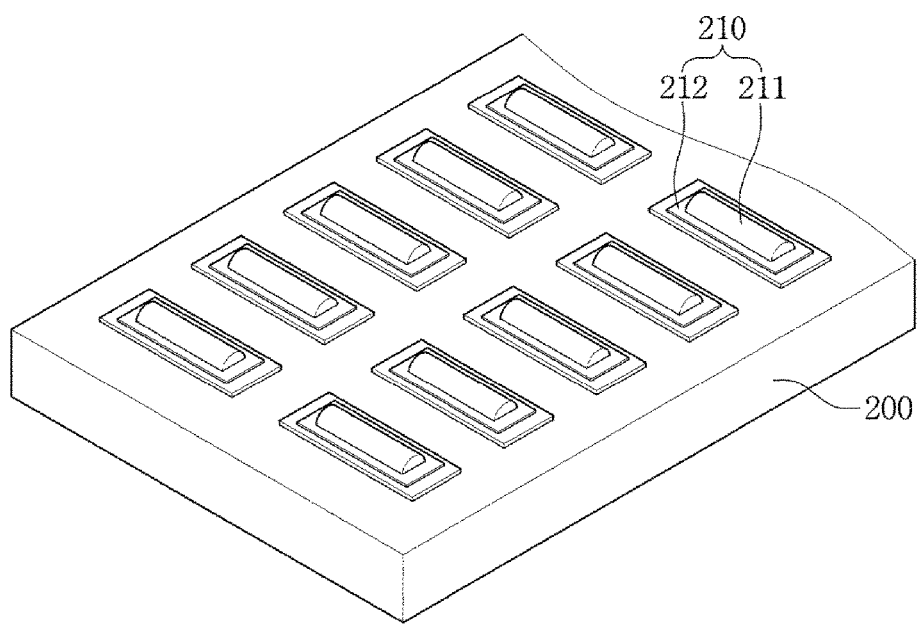
FIG. 2 is a perspective view illustrating a bump at a lower portion of the driving chip of FIG. 1.

FIG. 2 is a perspective view illustrating a bump formed at a lower portion of the driving chip 200 of FIG. 1.

Referring to FIG. 2, a bump 210 is provided in plurality arranged in a matrix at a lower portion of the driving chip 200, such as at a lower surface of a base or body thereof. Each of the bumps 210 includes an elastic support body 211 having elasticity and a bump wiring 212 which is on the elastic support body 211. The elastic support body 211 includes a polymer resin having elasticity. The bump wiring 212 includes a conductive material layer such as a metal layer disposed or formed above the elastic support body 211. The bump wiring 212 is connected to, such as being in direct contact with, a driving circuit 230 embedded in the driving chip 200, through a through hole defined in the driving chip 200 to input and output a driving signal therethrough.

A portion of an area of the bump wiring 212 supported by the elastic support body 211 directly contacts the terminal pad unit 111 of the display panel 100 to be electrically connected thereto. Since having elasticity, the elastic support body 211 may maintain an initial shape even if a pressure of the elastic limit of a material of the elastic support body 211 is applied thereto. The elastic support body 211 supports a lower portion of the bump wiring 212 at the distal end of the elastic support body 211 so that the bump wiring 212 contacts the terminal pad unit 111. The elastic support body 211 may include polyimide, polyacrylate, polycarbonate, polyepoxy, polyacryl or the like, or may be a copolymer including the above-described materials. An elastic modulus of the copolymer satisfying the above condition may be in a range of about 1.5 gigapascals (GPa) to about 5.0 GPa.

The bump wiring 212 may include a metal material or a metal oxide material having excellent conductivity. In an exemplary embodiment, for example, the bump wiring 212 may include gold, chromium, silver, molybdenum, aluminum, copper, titanium, indium-tin oxide or indium-zinc oxide. Further, the bump wiring 212 may include an alloy including at least two of gold, chromium, silver, molybdenum, aluminum, copper, titanium, indium-tin oxide, and indium-zinc oxide.

The bumps 210 may not be invariably arranged in the form of a matrix as illustrated in FIG. 2, and the arrangement of the bumps may be variously modified according to the size and shape of the driving chip 200, the number of input/output terminals thereof, a row arrangement, a multi-row arrangement and the like.

Figure 3:
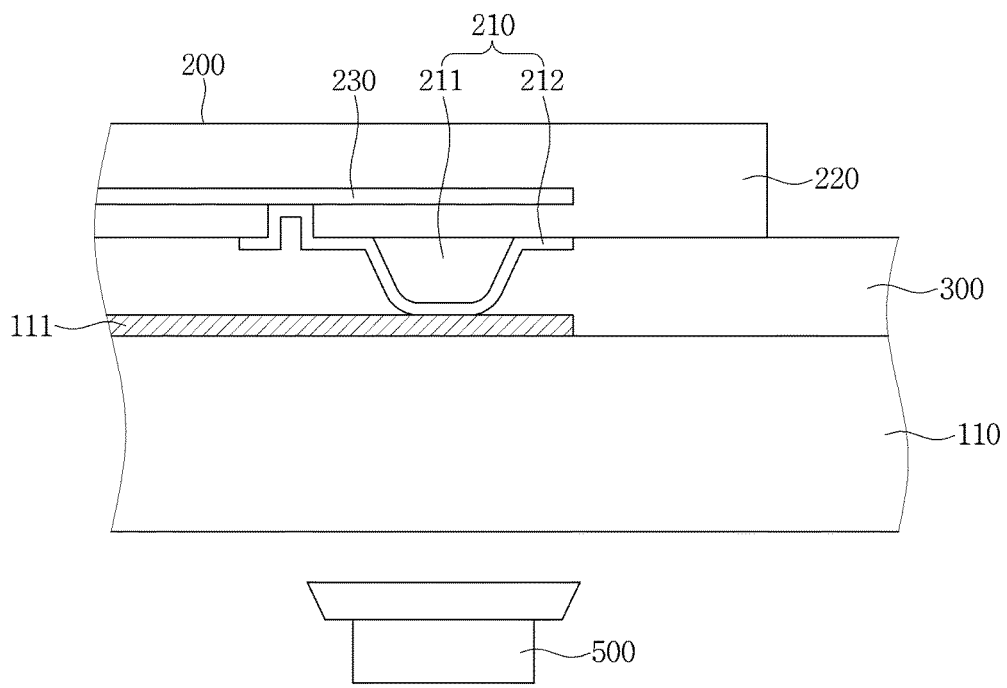
FIG. 3 is a cross-sectional view illustrating a connection portion between the driving chip and the display panel of FIG. 1.

FIG. 3 is a cross-sectional view illustrating a connection portion between the driving chip and the display panel of FIG. 1.

Referring to FIG. 3, the driving chip 200 includes a body 220 and bumps 210, and the driving circuit 230 is mounted in the body 220. The body 220 includes an insulating material. The driving circuit 230 may generate a driving signal suitable for the display panel 100 which uses an image signal and a control signal externally applied thereto to generate and display the image. In an exemplary embodiment, the driving circuit 230 may include a semiconductor structure such as being formed by a semiconductor process. The bump 210 includes the elastic support body 211 having elasticity and the bump wiring 212 which is on the elastic support body 211. The bump wirings 212 may be each be connected to the driving circuit 230 inside the driving chip 200 through or at a hole defined in the body 220.

A non-conductive film ("NCF") 300 may mount the driving chip 200 at the lower substrate 110. In mounting the driving chip 200 on the lower substrate 110, in an exemplary embodiment, the terminal pad unit 111 of the lower substrate 110 and the bump 210 of the driving chip 200 are aligned with each other, the non-conductive film 300 is placed therebetween at an initial contact area, and then a heat-pressing process is performed thereon at a relatively high temperature. The non-conductive film 300 having a predetermined fluidity by heat applied thereto flows and moves to a space between the body 220 of the driving chip 200 and the lower substrate 110 from the initial contact area between the terminal pad unit 111 and the bump 210, which is subject to the pressure from the heat-pressing process, and is then cured. In a thickness direction, a distance between the body 220 of the driving chip 200 and the lower substrate 110 of the display panel 100 is fixed by the cured non-conductive film 300, and the bump 210 of the driving chip 200 may maintain physical contact with the terminal pad unit 111 of the display panel 100.

More specifically, the terminal pad unit 111 of the display panel 100 directly contacts the bump wiring 212 of the bump 210, and the elastic support body 211 between the bump wiring 212 and the terminal pad unit 111 is deformed from an initial shape as being pressed in the heat-pressing process of the driving chip 200. An elastic force generated in the deformed elastic support body 211 acts in the direction toward a front surface of the bump wiring 212 (e.g., toward a distal end of the elastic support body 211) from a rear surface thereof (e.g., a base of the elastic support body 211 at the body 220) so that the bump wiring 212 may maintain the connection with the terminal pad unit 111.

The non-conductive film 300 has a certain degree of elasticity to effectively attach the driving chip 200 to the lower substrate 110 of the display panel 100, for example, an elastic modulus in a range of about 1.5 GPa to about 5.0 GPa. When the non-conductive film 300 has less elasticity than the above range, a defect may occur by collision between the driving chip 200 and the lower substrate 110 when the driving chip 200 is pressed against the display panel 100. In contrast, when the non-conductive film 300 has greater elasticity than the above range, the driving chip 200 may not be suitably attached to the display panel 100. The non-conductive film 300 may include a thermocurable polymer resin.

The connection state between the bump 210 of the driving chip 200 and the terminal pad unit 111 of the display panel 100 may be identified through an indentation inspection apparatus 500. The indentation inspection apparatus 500 inspects a concavo-convex structure (an indentation) of the terminal pad caused in the process of pressing the bump 210 and the terminal pad unit 111 to each other. The indentation may be analyzed by inspecting illuminance of a rear surface of the terminal pad unit 111 using an optical camera. However, when the bump 210 and the terminal pad unit 111 are connected to each other face to face without using an anisotropic conductive film ("ACF") as in the structure of FIG. 3, an indentation is generated in a planar manner, making analysis difficult.

Figure 4A:
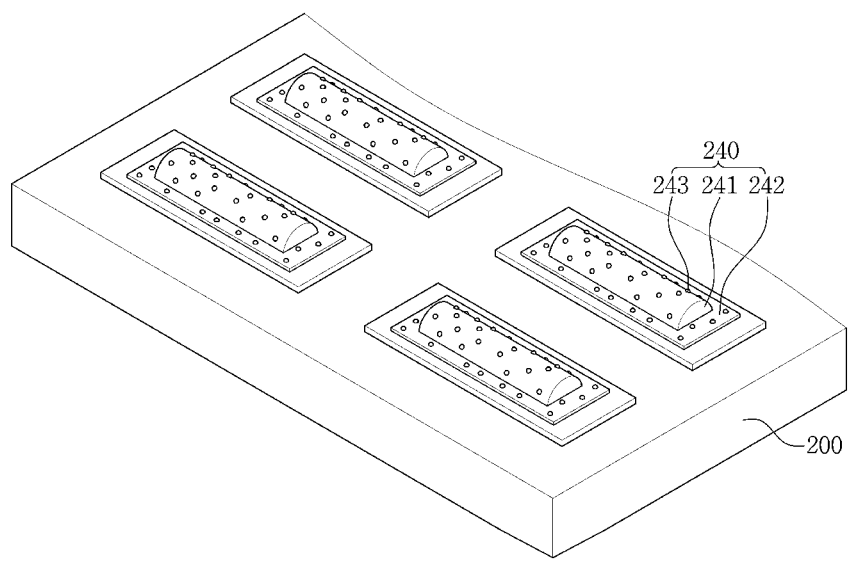
FIG. 4A is a perspective view illustrating an exemplary embodiment of a bump of a driving chip according to the invention.
Figure 4B:
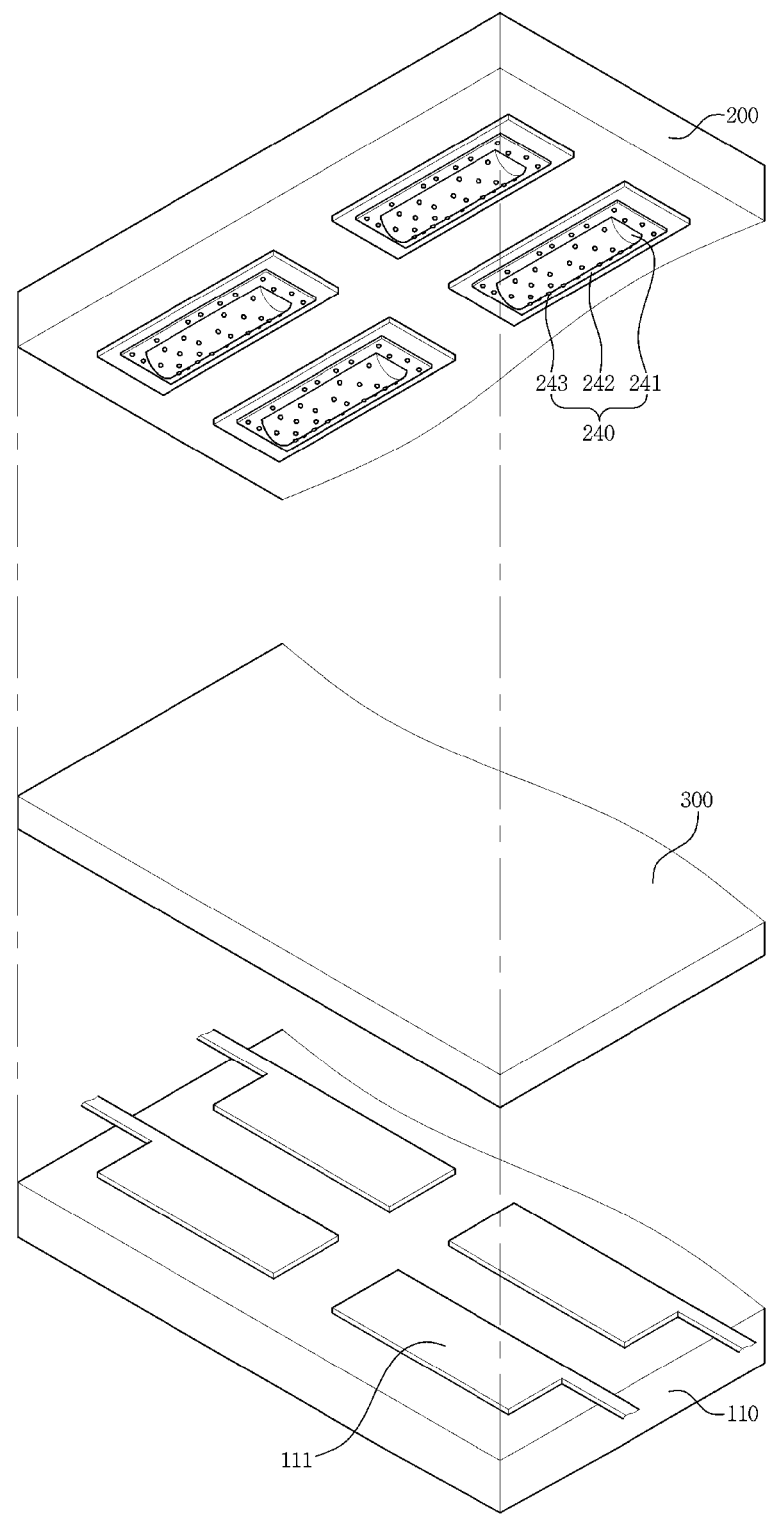
FIG. 4B is an exploded perspective view illustrating a coupling between a substrate pad unit and the bump of the driving chip of FIG. 4A.

FIG. 4A is a perspective view illustrating an exemplary embodiment of a bump 240 of a driving chip according to the invention, and FIG. 4B is an exploded perspective view illustrating a coupling between a terminal pad unit and the bump 240 of the driving chip of FIG. 4A.

Referring to FIGS. 4A and 4B, the bump 240 is provided in plural disposed on a surface of a driving chip 200. Each of the bumps 240 includes an elastic support body 241 having elasticity, a bump wiring 242 above the elastic support body 241, and a dispersed particle 243 overlapping the bump wiring 242.

The elastic support body 241 includes a polymer resin having elasticity. From a surface of the body of the driving chip 200, the elastic support body 241 is formed to have a height of about 7 micrometers (μm). The height may be taken from a base of the elastic support body 241 at the surface of the body, to a distal end of the elastic support body 241. The height of the elastic support body 241 may be a maximum dimension thereof with reference to the surface of the body.

The bump wirings 242 is formed as a conductive metal layer above the elastic support body 241 (e.g., at a side opposite to the body of the driving chip 200) and may directly contact a driving circuit 230 inside the driving chip 200. A driving signal may be input to the driving chip 200 and output therefrom through the bump wiring 242. In a normal direction to a respective surface on which the bump wiring 242 is disposed, the bump wiring 242 is formed to have a thickness in a range of about 1 μm to about 3 μm. The bump wiring 242 may cover an entirety of the elastic support body 241 and extend further than edges of the elastic support body 241 in the top plan view, but the invention is not limited thereto. That is, the elastic support body 241 may not be exposed from the bump wiring 242 thereon.

The dispersed particle 243 may be disposed or formed substantially simultaneously with the bump wiring 242, and may have conductivity or may not have conductivity. The dispersed particle 243 may have a particle diameter in a range of about 1 μm to about 5 μm. The particle diameter may be a maximum dimension of the dispersed particle 243. The particle diameter of the dispersed particle 243 is less than the height of the elastic support 241. The dispersed particle 243 may be located in an area at which the bump wirings 242 contacts a terminal pad unit 111 to leave an indentation on the terminal pad unit 111 in the pressing process which couples the driving chip 200 and the display panel 100 to each other. The dispersed particle 243 may be provided in plurality within the bump wiring 242 of a respective bump 240.

As compared to the indentation caused by the surface-to-surface coupling in the conventional display panel described above with reference to FIG. 3, one or more embodiment of the driving chip 200 according to the invention causes an indentation by the dispersed particles 243 and such indentation may be relatively easily inspected by the indentation inspection apparatus 500 so that the mounting state of the driving chip 200 relative to the display panel 100 may be clearly identified.

In the case where the dispersed particle 243 is a conductive particle, the dispersed particle 243 may include a conductive material, e.g., a metal, such as nickel, iron, copper, aluminum, tin, zinc, chromium, cobalt, silver, gold or the like, a metal oxide thereof, solder, and carbon. In contrast, in the case where the dispersed particle 243 is a non-conductive particle, the dispersed particle 243 may include ceramic, metal oxide, crosslinked or non-crosslinked organic fine particles or silicon fine particles including a polymer based on polymethyl methacrylate, polystyrene, polyurethane, an acryl-styrene copolymer, benzoguanamine, melamine, polycarbonate and the like.

In an exemplary embodiment of manufacturing a driving chip, the bump wiring 242 may be disposed or formed on the elastic support body 241 in an electroless plating method and the dispersed particles 243 may be formed substantially simultaneously with the bump wiring 242. The dispersed particle 243 and the bump wiring 242 may be substantially simultaneously formed by dispersing the dispersed particles 243 in a plating solution for plating the bump wiring 242. When the bump wiring 242 and the dispersed particle 243 are formed substantially simultaneously, the dispersed particles 243 may be impregnated to the bump wirings 242. That is, a metal layer of the bump wiring 242 may coat an entire peripheral portion of the dispersed particles 243.

In a normal direction to a respective surface on which the bump wiring 212 is disposed, the bump wiring 242 may have a thickness in a range of about 1 µm to about 3 µm and the dispersed particles 243 dispersed within the bump wiring 242 may respectively have a particle diameter in a range of about 1 µm to about 5 µm.

Referring to FIG. 4B, the terminal pad unit 111 is located at an upper portion or surface of the lower substrate 110 which faces the bump 240 at a lower portion or surface of the driving chip 200. In FIG. 4B, only a portion of the terminal pad unit 111 at an area of the lower substrate 110 is enlarged for convenience of illustration. A non-conductive film 300 is interposed between the bump 240 and the terminal pad unit 111.

In mounting the driving chip 200 on the lower substrate 110, in an exemplary embodiment, when the driving chip 200, the non-conductive film 300 and the lower substrate 110 are aligned and then heat-pressed, the non-conductive film 300 interposed between the bump wiring 242 and the terminal pad unit 111 is removed or moved by pressure such that non-conductive film 300 is not disposed between the bump wiring 242 and the terminal pad unit 111 and the bump wiring 242 including the dispersed particles 243 therein or thereon contacts the terminal pad unit 111. The non-conductive film 300 having fluidity moves from between the bump wiring 242 and the terminal pad unit 111 to a space between the bumps 240 spaced apart from each other in the top plan view. By a pressure applied from the mounting of the driving chip 200, the dispersed particles 243 in or on the bump wiring 242 leave indentations on the terminal pad unit 111 contacted by the bump wiring 242. That is, since the dispersed particles 243 and/or the bump wiring 242 are essentially not deformed during the pressing process such as owing to the materials thereof, a form of the dispersed particles 243 and/or the bump wiring 242 is maintained to form the indentations.

Figure 5:
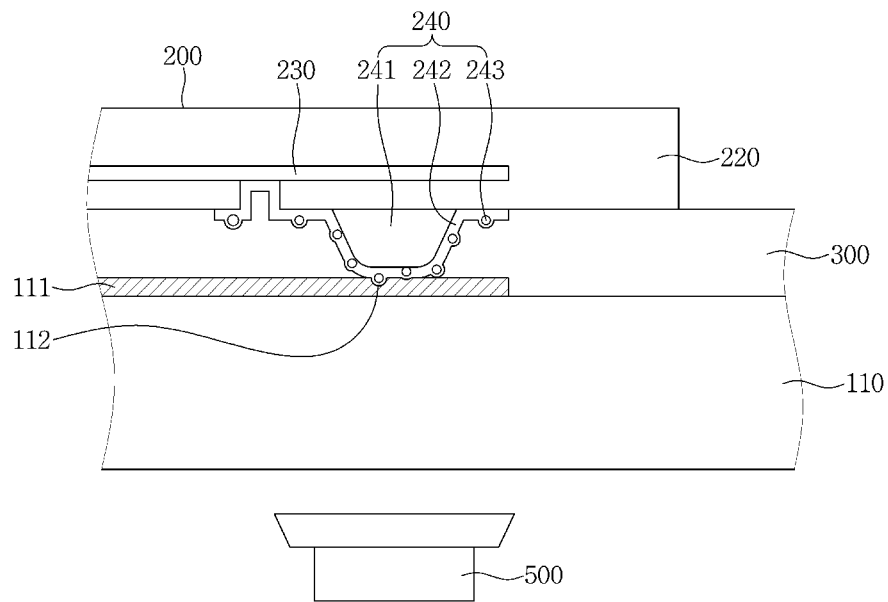
FIG. 5 is a cross-sectional view illustrating an exemplary embodiment of a display panel coupled with the bump of the driving chip of FIGS. 4A and 4B according to the invention.

FIG. 5 is a cross-sectional view illustrating an exemplary embodiment of a display panel to which the bump 240 of the driving chip of FIGS. 4A and 4B is coupled.

Referring to FIG. 5, the terminal pad unit 111 located at the lower substrate 110 directly contacts the bumps 240 of the driving chip 200.

The bump 240 includes the elastic support body 241 on a surface of the body 220 of the driving chip 200, the bump wiring 242 passing through a through hole defined in the body 220 to be connected to the driving circuit 230 inside the body 220, and the dispersed particles 243 dispersed on and/or in the bump wiring 242. The dispersed particles 243 may define a protrusion of the bump wiring 242 at the dispersed particles 243, where the thickness of the bump wiring 242 is greatest at the dispersed particles 243 than at remaining portions thereof. That is, the bump wiring 242 may be disposed furthest from the elastic support body 241 at the dispersed particles 243.

The non-conductive film ("NCF") 300 may mount the driving chip 200 at the lower substrate 110. In mounting the driving chip 200 on the lower substrate 110, in an exemplary embodiment, when the non-conductive film ("NCF") 300 mounts the driving chip 200 at the lower substrate 110, the terminal pad unit 111 of the lower substrate 110 and the bump 240 of the driving chip 200 are aligned and the non-conductive film 300 is disposed therebetween at an initial contact area, and a heat-pressing process is performed thereon at a relatively high temperature. The non-conductive film 300 having a predetermined fluidity by heat moves to a space between the body 220 of the driving chip 200 and the lower substrate 110 from the initial contact area between the terminal pad unit 111 and the bump 210, which is subject to the pressure from the heat-pressing process, and is then cured. In a thickness direction, a distance between the body 220 of the driving chip 200 and the lower substrate 110 is fixed by the cured non-conductive film 300, and the bump 210 may maintain physical contact with the terminal pad unit 111. The dispersed particle 243 of the bump 240 leaves a concave indentation or recess 112 at a surface of the terminal pad unit 111 from the pressing of the terminal pad unit 111 with the driving chip 200 during the pressing process. That is, the indentation 112 is generated in a non-planar manner owing to the irregular surface profile of the bump wiring 242 at the dispersed particle 243, making analysis of the indentation easier.

The indentation 112 defined in the terminal pad 111 may be identified using the indentation inspection apparatus 500. The indentation inspection apparatus 500 may analyze the indentation by inspecting illuminance of a rear surface of the terminal pad unit 111 using an optical camera. The indentation 112 of the terminal pad unit 111 defined by the dispersed particles 243 is easy to detect so that the mounting state of the driving chip 200 may be identified.

Figure 6A:
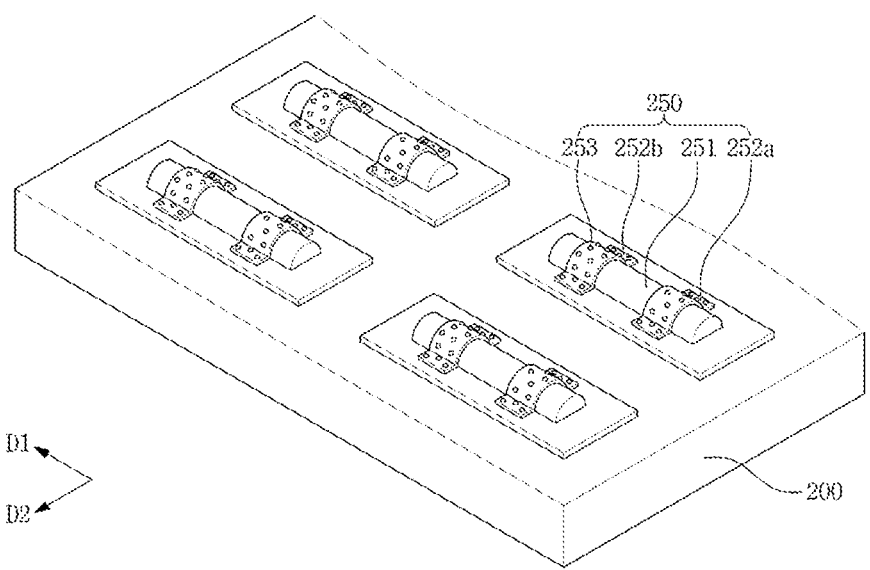
FIG. 6A is a perspective view illustrating an alternative exemplary embodiment of a bump of a driving chip according to the invention.

FIG. 6A is a perspective view illustrating an alternative exemplary embodiment of a bump of a driving chip according to the invention.

Figure 6B:
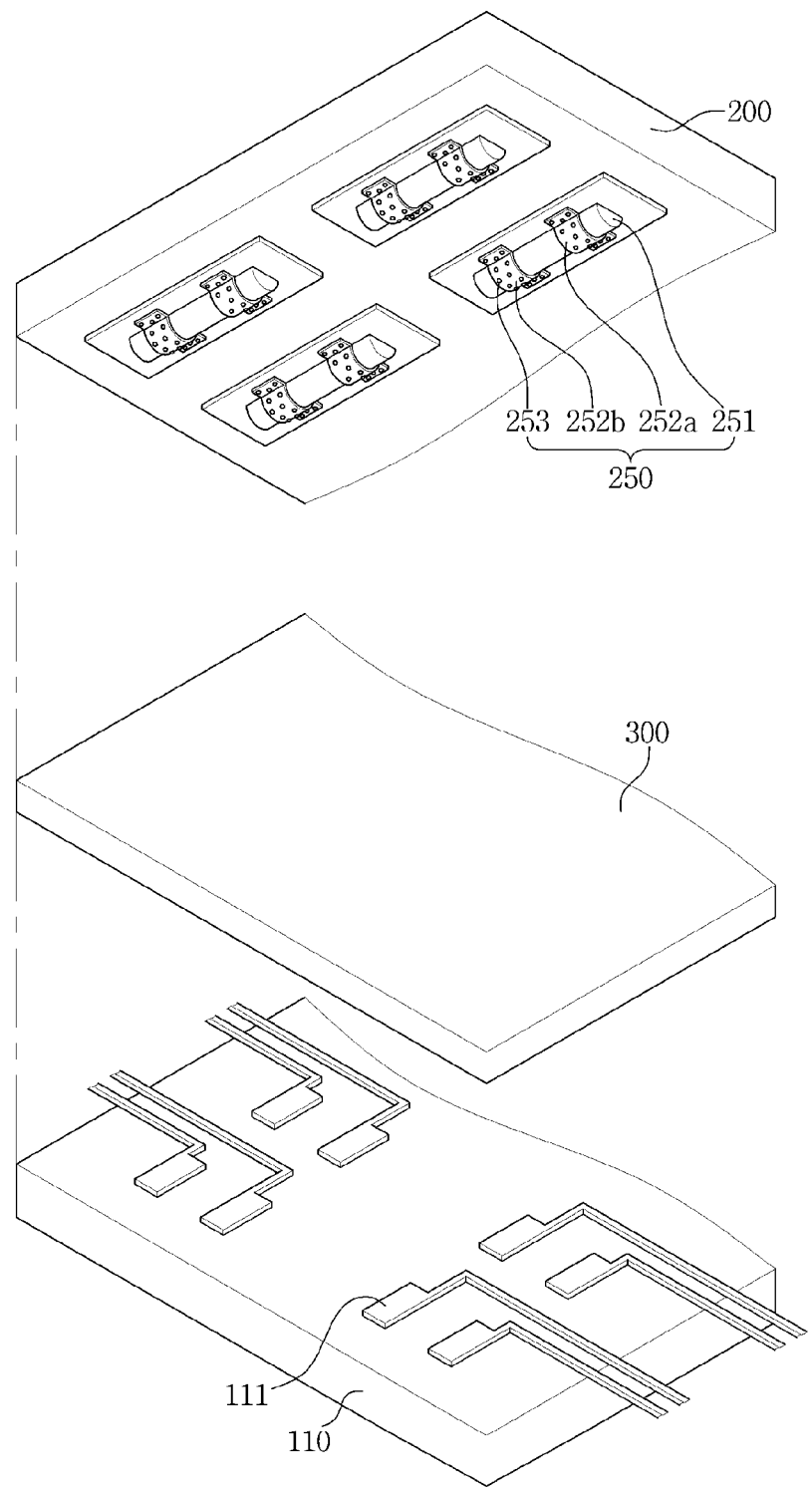
FIG. 6B is an exploded perspective view illustrating a coupling between a terminal pad unit and the bump of the driving chip of FIG. 6A.

FIG. 6B is an exploded perspective view illustrating a coupling between a terminal pad unit 111 and the bump of the driving chip of FIG. 6A.

Referring to FIGS. 6A and 6B, the driving chip 200 may include a bump 250 arranged in plurality in the form of a matrix on a rear surface of the driving chip 200.

The bump 250 includes an elastic support body 251 which defines a length thereof extending in a first direction D1, a plurality of bump wirings 252a and 252b which each define a length thereof extending in a second direction D2 which crosses and intersects the length extension direction of the elastic support body 251, and dispersed particles 253 overlapping the bump wirings 252a and 252b. The driving chip 200 may be disposed in a plane parallel to a plane defined by the first and second directions D1 and D2. A thickness direction may be defined in a direction normal to the plane defined by the first and second directions D1 and D2. Widths of respective elements are defined smaller than the lengths thereof, in a direction normal to the respective length extension direction.

The elastic support body 251 may support the plurality of bump wirings 252a and 252b at the bottom of the plurality of bump wirings 252a and 252b (e.g., at a surface of the wirings facing the elastic support body 251). In addition, lengths of the elastic support body 251 and the plurality of bump wirings 252a and 252b are arranged to cross each other so that a side surface portion of the elastic support body 251 at which the bump wirings 252a and 252b are not disposed may be secured relative to the body of the driving chip 200 to prevent disconnection of the bump wirings 252a and 252b that may occur when the side surface portion of the elastic support body 251 expands.

In an exemplary embodiment of mounting the driving chip 200 at a lower substrate 110, for example, the pressing process for mounting the driving chip 200 at the lower substrate 110 is performed by pressing using a pressurizer (not illustrated) heated to about 130 degrees Celsius (° C.) to about 180° C. at a pressure of about 30 megapascals (MPa) to about 150 MPa for about 2 seconds to about 15 seconds. During the pressing process, the elastic support body 251 is subject to a downward pressure as the bump wirings 252a and 252b located thereon contact the terminal pad unit 111, such that the side surface portion (e.g., short side and/or long side) of the elastic support body 251 expands. In the case where the bump wirings 252a and 252b are disposed or formed on an entire of the expanding portion of the side surface portion of the elastic support body 251, disconnection may occur due to such expansion. However, the bump wirings 252a and 252b according to an exemplary embodiment separated from each other along the side surface portion of the elastic support body 251 do not cover the entire expanding portion of the side surface portion of the elastic support body 251, leaving an uncovered or exposed portion thereof, and thus disconnection of the bump wirings 252a and 252b may be substantially minimized.

In addition, the bump 250 may include dispersed particles 253. The dispersed particles 253 may be disposed or formed substantially simultaneously with the bump wirings 252a and 252b, and may have conductivity or may not have conductivity. Referring to the above discussion, the dispersed particles 253 may leave an indentation on the terminal pad unit 111 of the lower substrate 110 during the pressing process so that the mounting state of terminal of the driving chip 200 may be inspected by an indentation inspection apparatus.

Referring to FIG. 6B, the terminal pad unit 111 is located at an upper portion or surface of the lower substrate 110 which faces the bump 250 formed at a lower portion or surface of the driving chip 200. A non-conductive film 300 is interposed between the bump 250 and the terminal pad unit 111. The plurality of bump wirings 252a and 252b and the terminal pad unit 111 are connected to each other in a corresponding manner.

Figure 7A:
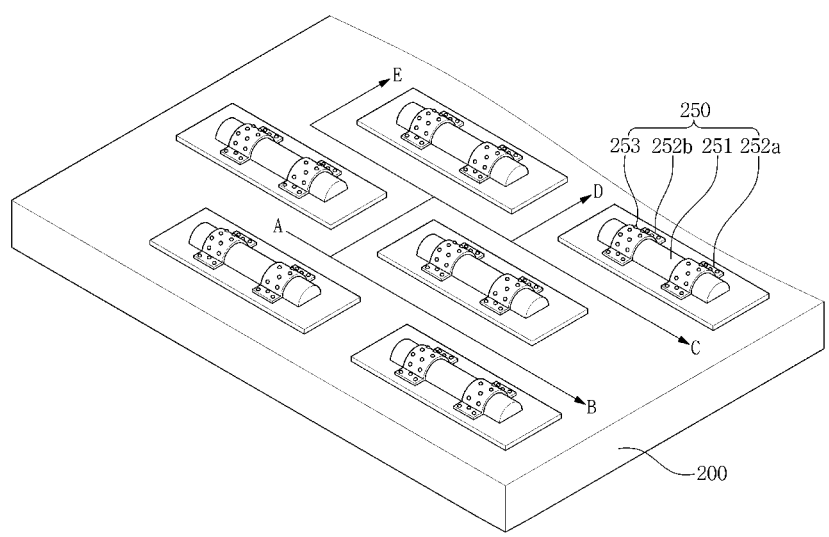
FIG. 7A is a perspective view illustrating still another exemplary embodiment of a bump of a driving chip according to the invention.

FIG. 7A is a perspective view illustrating still another exemplary embodiment of a bump 250 of a driving chip according to the invention.

Figure 7B:
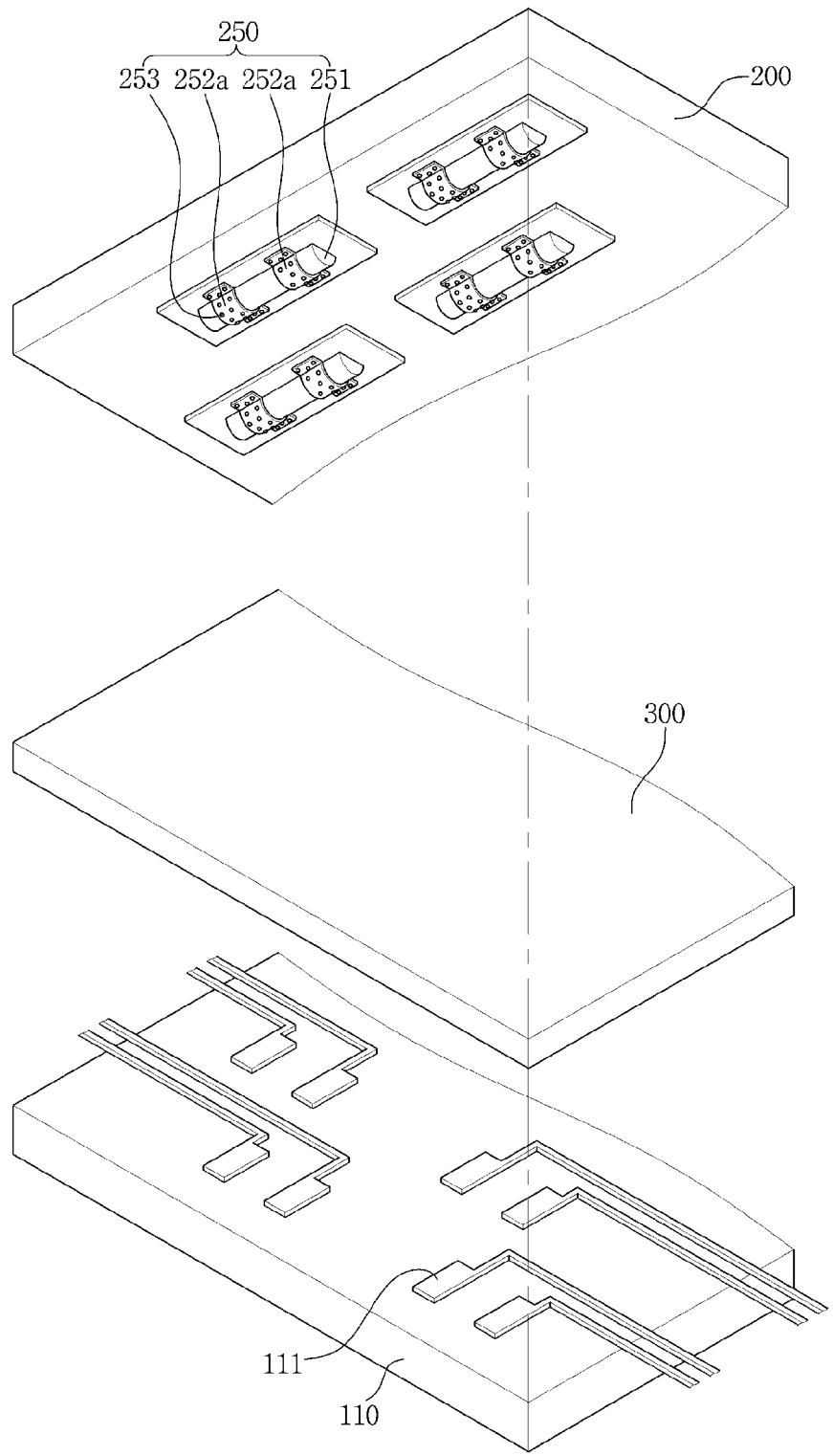
FIG. 7B is an exploded perspective view illustrating a coupling between a terminal pad unit and the bump of the driving chip of FIG. 7A.

FIG. 7B is a schematic view illustrating a coupling between a terminal pad unit 111 and the bump 250 of the driving chip of FIG. 7A.

Referring to FIGS. 7A and 7B, the bumps 250 may be disposed on a surface of a driving chip 200 in a staggered (e.g., zigzag) pattern with respect to one direction while being aligned in another direction which crosses the one direction. A flow channel of a non-conductive film 300 is formed along a direction of an arrow from a predetermined point A between the bumps 250 toward outer side surfaces B, C, D and E of the driving chip 200. The flow channel refers to a path or passage through which the non-conductive film 300 initially between the driving chip 200 and the lower substrate 110 is heated to a temperature ranging from about 130° C. to 180° C. moves when pressed to flow along such path or passage in a liquid phase.

As illustrated in FIG. 7A, the flow channel having a bent shape due to the staggered arrangement of the bumps 250 may reduce or effectively prevent the non-conductive film 300 from moving out of the driving chip 200 in a linear direction. The staggered arrangement structure of the bumps 250 may allow the non-conductive film 300 to stay in a space between the driving chip 200 and the lower substrate 110 so that the non-conductive film 300 may fill an area not filled with the non-conductive film 300 when the non-conductive film 300 is pressed. Accordingly, the driving chip 200 and the lower substrate 110 may be firmly fixed to each other.

The bump 250 may further include dispersed particles 253.

Referring to FIG. 7B, the terminal pad unit 111 is located at an upper portion or surface of the lower substrate 110 which faces the bump 250 formed at a lower portion or surface of the driving chip 200. As the bumps 250 are arranged in a staggered pattern, the terminal pad units 111 corresponding to the bumps 250 are also arranged in a staggered pattern.

Figure 8A:
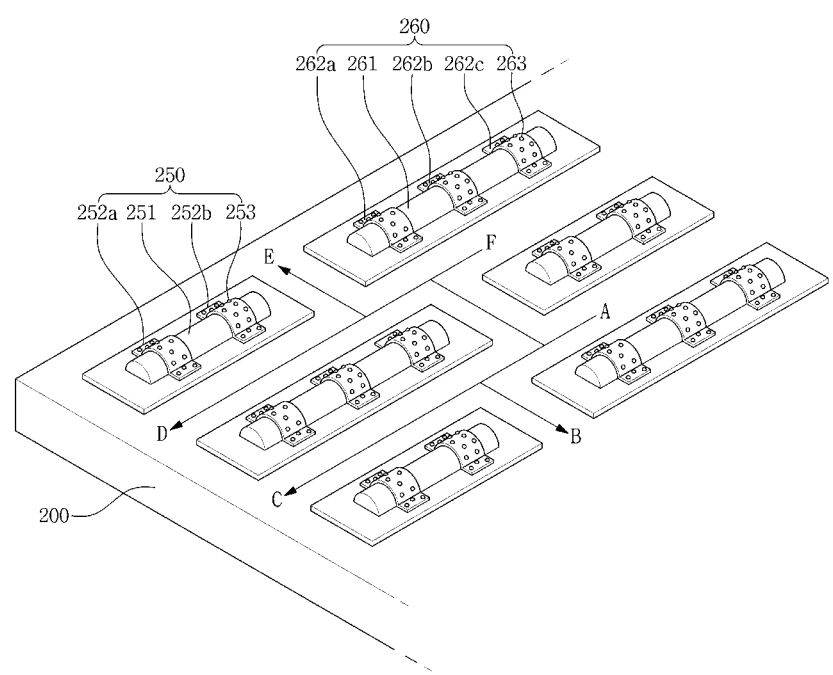
FIG. 8A is a perspective view illustrating still another exemplary embodiment of a bump of a driving chip according to the invention.

FIG. 8A is a perspective view illustrating still another exemplary embodiment of bumps 250 and 260 of a driving chip according to the invention.

Figure 8B:
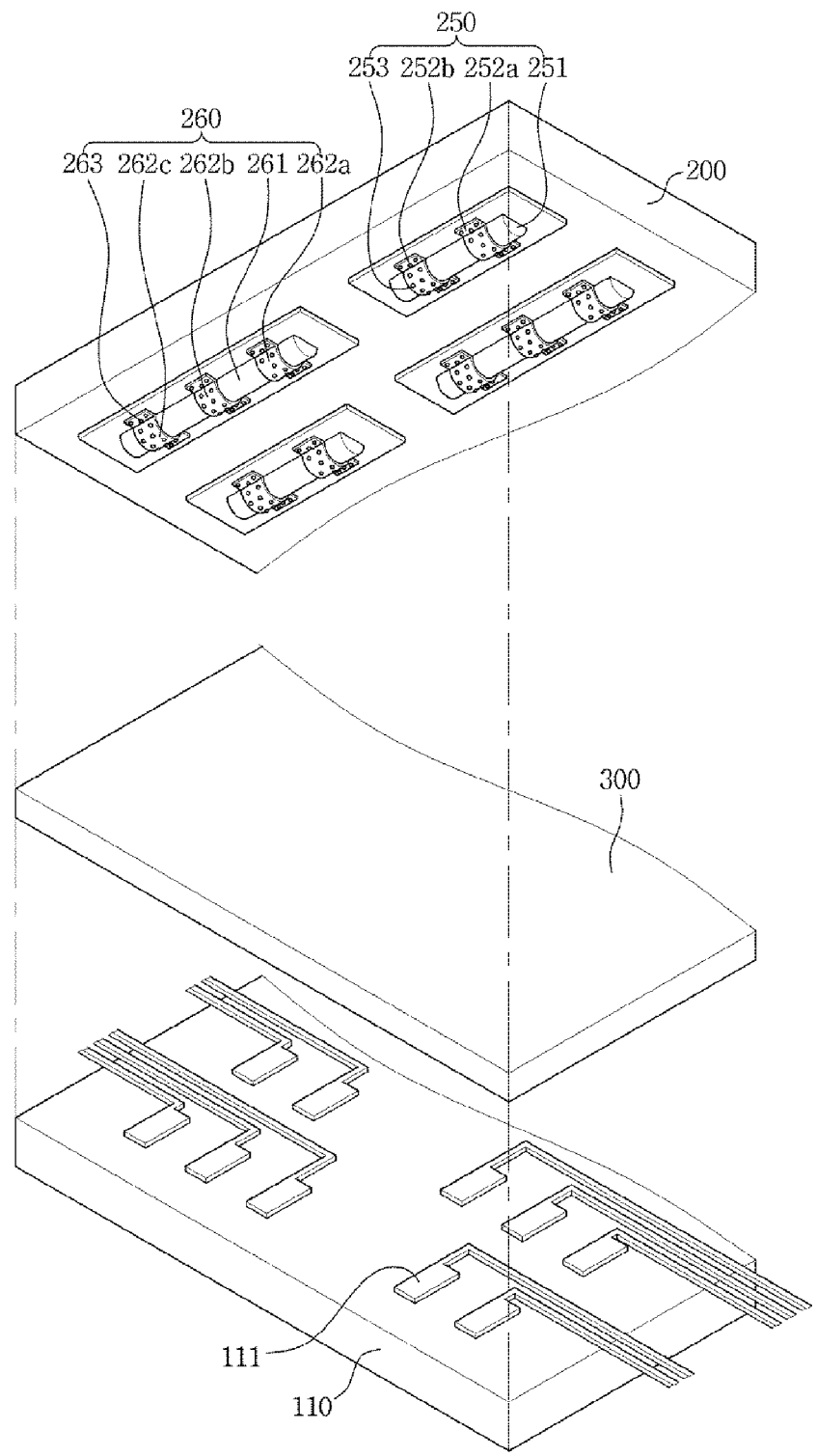
FIG. 8B is an exploded perspective view illustrating a coupling between a terminal pad unit and the bump of the driving chip of FIG. 8A.

FIG. 8B is an exploded perspective view illustrating a coupling between a terminal pad unit and the bumps 250 and 260 of the driving chip of FIG. 8A.

Referring to FIGS. 8A and 8B, the driving chip 200 includes a first bump 250 including a first elastic support body 251 and two bump wirings 252a and 252b, and a second bump 260 including a second elastic support body 261 and three bump wirings 262a, 262b and 262c. Each of the first and second bumps 250 and 260 is provided in plurality to be arranged in rows and columns. The first bump 250 and the second bump 260 are disposed adjacent to one another in a row direction and in a column direction.

The first bumps 250 and the second bumps 260 respectively including the first elastic support body 251 and the second elastic support body 261 each having different lengths may be alternately arranged in the row direction and the column direction. The different lengths of the elastic support bodies effectively form a staggered pattern. A flow channel may be formed between the first bump 250 and the second bump 260 along a direction of an arrow from a predetermined point A toward outer side surfaces B, C, D, E and F of the driving chip 200 so that a non-conductive film 300 may move therethrough. The flow channel may have a bent passage due to the arrangement shape of the first bump 250 and the second bump 260. Due to the arrangement structure of the first bump 250 and the second bump 260, the non-conductive film 300 may not directly flow outwardly of the driving chip 200 and stay in a space between the driving chip 200 and the lower substrate 110 to fill an area not filled with the non-conductive film 300, such that the driving chip 200 and the lower substrate 110 may be firmly fixed to each other.

The first bump 250 and the second bump 260 may further include dispersed particles 253 and 263, respectively.

Referring to FIG. 8B, the terminal pad unit 111 is positioned at an upper portion or surface of the lower substrate 110 facing the first bump 250 and the second bump 260 formed at a lower portion or surface of the driving chip 200. As the first bump 250 and the second bump 260 are arranged in a staggered pattern, the terminal pad units 111 corresponding to the first bump 250 and the second bump 260 are also arranged in a staggered pattern.

FIGS. 9A, 9B, 9C, 9D, 9E and 9F are respectively mimetic diagrams illustrating exemplary embodiments of a dispersed particle in a bump of a driving chip according to the invention. The dispersed particle 253 is discussed below as an example, but any of the shapes in FIGS. 9A to 9F may be applied to the dispersed particles 263.

Figure 9A:
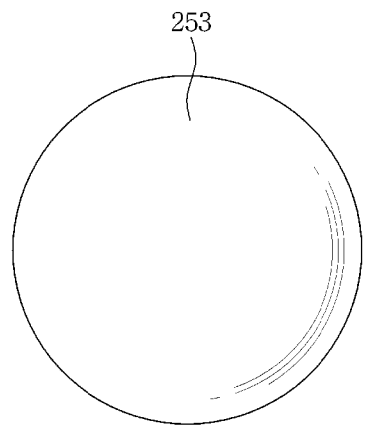
FIGS. 9A, 9B, 9C, 9D, 9E and 9F are respectively mimetic diagrams illustrating exemplary embodiments of a disperse particle in a bump of a driving chip according to the invention.
Figure 9B:
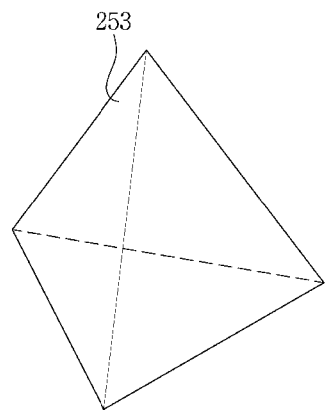
Figure 9C:
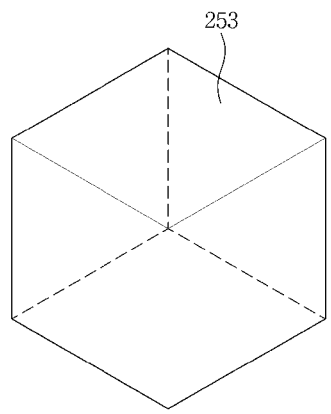
Figure 9D:
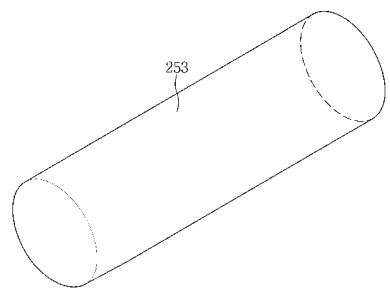
Figure 9E:
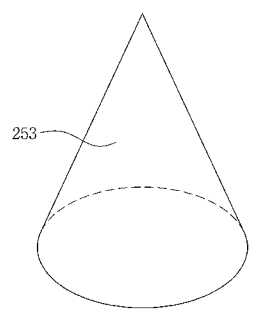

Referring to FIGS. 9A, 9B, 9C, 9D and 9E, the dispersed particle 253 may have a polyhedral structure such as a spherical shape (FIG. 9A), a triangular pyramid shape (FIG. 9B), a hexahedral shape (FIG. 9C), a cylindrical shape (FIG. 9D) or a conical shape (FIG. 9E).

The dispersed particle 253 may be a conductive particle or may be a non-conductive particle.

In the case where the dispersed particle 253 is a conductive particle, the dispersed particle 253 may include a metal material, such as nickel (Ni), iron (Fe), copper (Cu), aluminum (Al), tin (Sn), zinc (Zn), chromium (Cr), cobalt (Co), gold (Au) or silver (Ag), or a metal alloy thereof.

In the case where the dispersed particle 253 is a conductive particle, the dispersed particle 253 may improve conductivity between the bump wiring 252 and the terminal pad unit 111 in the pressing process. However, it is desirable that the dispersed particles 253 be provided in an area of the bump wiring 252 not to cause disconnection among the bump wirings 252 adjacent to one another depending on the dispersed positions.

In the case where the dispersed particle 253 is a non-conductive particle, the dispersed particle 253 may include glass, polymer or ceramic. Examples of the polymer material may include polytetrafluoroethylene ("PTFE" such as brand name Teflon®) or polyethylene, and examples of the ceramic material may include alumina, silica, glass or silicon carbide.

In the case where the dispersed particle 253 is a non-conductive particle, it is desirable that a dispersion concentration of the non-conductive dispersed particles 253 be less than that of conductive particles so that the conductivity between the bump wiring 252 and the terminal pad unit 111 is not lowered by the non-conductive dispersed particles 253.

An example of a method of manufacturing the dispersed particle 253 having a polygonal three-dimensional structure includes casting using a casting mold formed by laser processing in which a resin having fluidity is injected into the casting mold and then cured. Alternatively, based on a printing electronic technology, a master casting mold may be duplicated by, for example, printing a fluoropolymer into the master casting mold. Manufacturing the dispersed particles through the casting method is advantageous in that dispersed particles of a uniform size may be provided.

The dispersed particles 253 may be formed by crushing a resin block. It is preferable that the dispersed particles 253 have a polygonal three-dimensional structure having vertexes, rather than spherical particles, so as to more readily form an indentation. The pulverized resin tends to have a morphologically irregular multi-faceted structure. Since not having a uniform shape, the pulverized resin particles may undergo a primary filtering process. In the case where the particle size is too small, the resin particles may not leave an indentation, and in the case where the particle size is too large, the resin particles may interrupt contact between the pad unit and the bump. In general, a size of the dispersed particles 253 may have a length or maximum dimension in a range of about 1 μm to about 5 μm.

Figure 9F:
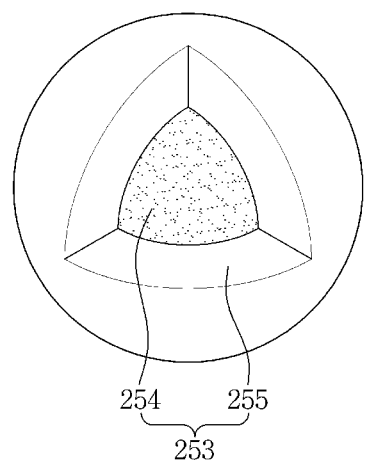

Referring to FIG. 9F, the dispersed particle 253 may have a structure in which a non-conductive coating film 255 is disposed on such as being coated on a conductive nucleus 254. The conductive nucleus 254 may include a metal material, such as nickel (Ni), iron (Fe), copper (Cu), aluminum (Al), tin (Sn), zinc (Zn), chromium (Cr), cobalt (Co), gold (Au) or silver (Ag), or a metal oxide thereof. The non-conductive coating film 255 may include a thermoplastic polymer resin, such as a polyethylene resin, polypropylene resin, a polybutylene resin, a polymethacrylic resin, a methylene resin, a polystyrene resin, an acrylonitrile-styrene resin, an acrylonitrile-styrene-butadiene resin, a vinyl resin, a divinylbenzene resin, a polyamide resin, a polyester resin, a polycarbonate resin, a polyacetal resin, a polyethersulfone resin, a polyphenylene oxide resin, a polyphenylene sulfide resin, a polysulfone resin and a polyurethane resin, as well as a thermocurable polymer resin, such as a phenol resin, a urea resin, a melamine resin, a fluorine resin, a polyester resin, an epoxy resin, a silicon resin, a polyimide resin, a polyurethane resin, a propylene resin and a polyolefin resin.

In the case of the dispersed particle 253 including the coated conductive nucleus 254 of FIG. 9E, the non-conductive coating film 255 may be broken between the bump wiring 252 and the terminal pad unit 111 in the pressing process of the driving chip 200, and the conductive nucleus 254 may be externally exposed to electrically contact the bump wiring 252 and the terminal pad unit 111 and to leave an indentation on the terminal pad unit 111. In addition, dispersed particles 253 located in a pressure-free position in the pressing process may maintain an insulated state to prevent erroneous electrical contact between the bump wirings 252 adjacent to one another.

The shapes of the dispersed particles 253 illustrated FIGS. 9A, 9B, 9C, 9D and 9E are illustrative only, and the dispersed particles 253 may include a mixture of the dispersed particles 253 among the shapes of FIGS. 9A, 9B, 9C, 9D and 9E, and may include a mixture of conductive dispersed particles and non-conductive dispersed particles.

Figure 10:
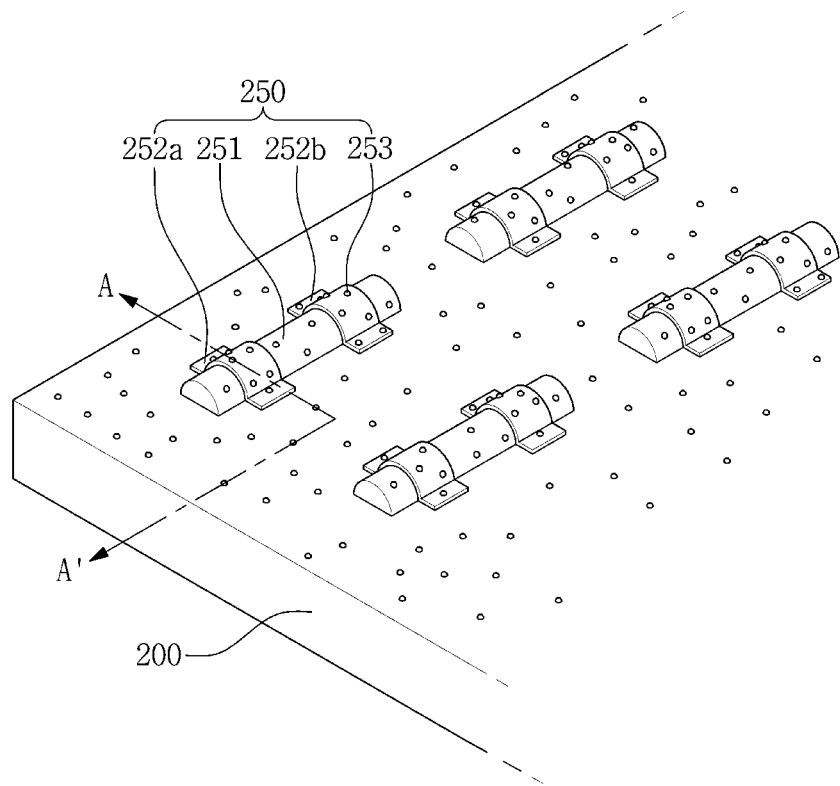
FIG. 10 is a perspective view illustrating yet another exemplary embodiment of a bump of a driving chip according to the invention.

FIG. 10 is a perspective view illustrating yet another exemplary embodiment of a bump 250 of a driving chip according to the invention.

Figure 11:
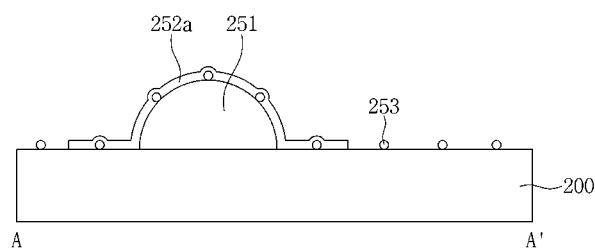
FIG. 11 is a cross-sectional view illustrating the bump of the driving chip taken along line A-A' of FIG. 10.

FIG. 11 is a cross-sectional view illustrating the bump 250 of the driving chip taken along line A-A' of FIG. 10.

Referring to FIGS. 10 and 11, the bump 250 including one elastic support body 251 and two bump wirings 252a and 252b may be arranged in plurality in the form of a matrix on a rear surface of a driving chip 200. Dispersed particles 253 may be dispersed at an entire portion of a rear surface of the driving chip 200 exposed by the bumps 250 and on the elastic support body 251 of the bump 250. Although not explicitly shown in FIGS. 10 and 11, the dispersed particles 253 at the exposed rear surface of the driving chip 200 would be disposed between driving chip 200 and the non-conductive film 300 (refer to FIG. 5). The plurality of bump wirings 252a and 252b may lengthwise extend in a direction intersecting a length extension direction of the elastic support body 251, and may be disposed on the elastic support body 251 and the dispersed particles 253.

In an exemplary embodiment of manufacturing a driving chip, the dispersed particles 253 may be disposed on the rear surface of the driving chip 200 by coating a solution including the dispersed particles 253 on the rear surface of the driving chip 200. In general, the solution may include a polymer resin, a surfactant and a dispersion solvent. The solution in which the dispersed particles 253 are dispersed is coated on the rear surface of the driving chip 200 in a method such as spraying and then the solvent is removed through a heat treatment or a drying process so that the dispersed particles 253 may remain to be uniformly dispersed on the rear surface of the driving chip 200 and fixed thereto. In addition, a portion of the driving chip 200 may be masked and then the mask is removed after coating such that the distribution area of the dispersed particles 253 may be adjusted. The dispersed particles distributed by the coating method may be disposed between the bump wiring 252 and the elastic support body 251.

As set forth hereinabove, in a relatively high-resolution display panel according to one or more exemplary embodiments, a multi-channel driving chip for which the polymer bump including the dispersed particles is applied is mounted on a substrate of the display panel to directly contact the substrate, and the mounting state may be inspected using an indentation inspection apparatus.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. A display device comprising:
   a display panel driven to display an image, the display panel comprising a substrate, the substrate comprising a display area at which the image is displayed;
   a terminal pad on the substrate and through which a driving signal is applied to the display area;
   a driving chip through which the driving signal is applied to the terminal pad; and
   a non-conductive film which fixes the driving chip to the substrate,
   wherein the driving chip comprises:
      an elastic support body projected from a surface of the driving chip;
      a bump wiring on the elastic support body, the bump wiring directly contacting the terminal pad to apply the driving signal to the terminal pad; and
      a dispersed particle on the elastic support body,
      wherein
      the dispersed particle is disposed inside a first portion of the bump wiring,
      a second portion of the bump wiring is adjacent to the first portion thereof,
      the first portion of the bump wiring at the dispersed particle protrudes further from the elastic support body than the second portion of the bump wiring adjacent to the first portion thereof, and
      the protruded first portion of the bump wiring corresponds to a shape of the dispersed particle.

2. The display device as claimed in claim 1, wherein the non-conductive film is between the driving chip and the substrate, the non-conductive film comprising a thermocurable resin.

3. The display device as claimed in claim 1, wherein the dispersed particle has at least one shape of: a spherical shape, a triangular pyramid shape, a hexahedral shape, a cylindrical shape and a polyhedral shape.

4. The display device as claimed in claim 1, wherein the dispersed particle has a particle diameter less than a height of the elastic support body with respect to the surface of the driving chip.

5. The display device as claimed in claim 4, wherein the particle diameter of the dispersed particle is in a range of about 1 micrometer to about 5 micrometers.

6. The display device as claimed in claim 5, wherein an entire surface of the dispersed particle is enclosed by the first portion of the bump wiring.

7. The display device as claimed in claim 6, wherein
   contact of the bump wiring of the driving chip to the terminal pad contacts the protruded first portion of the bump wiring at the dispersed particle to the terminal pad,
   contact of the protruded first portion of the bump wiring at the dispersed particle to the terminal pad defines a concave portion thereof at which the protruded first portion of the bump wiring directly contacts the terminal pad, and
   a shape of the concave portion corresponds to a shape of the protruded first portion of the bump wiring at the dispersed particle.

8. The display device as claimed in claim 7, wherein the driving chip further comprises a driving circuit to which the portion of the bump wiring is connected.

9. The display device as claimed in claim 2, wherein the dispersed particle directly contacts the elastic support body.

10. The display device as claimed in claim 9, wherein the dispersed particle is provided in plurality and is further between the non-conductive film and a portion of the driving chip exposed from the bump wiring.

11. The display device as claimed in claim 1, wherein a length extension direction of the elastic support body and a length extension direction of the bump wiring intersect each other.

12. A display device comprising:
   a display panel driven to display an image, the display panel comprising a substrate, the substrate comprising a display area at which the image is displayed;
   a terminal pad on the substrate and through which a driving signal is applied to the display area;
   a driving chip through which the driving signal is applied to the terminal pad, comprising:
      an elastic support body projected from a surface of the driving chip;
      a bump wiring provided in plurality on one elastic support body, the bump wiring directly contacting the terminal pad to apply the driving signal to the terminal pad, and
      a dispersed particle on the elastic support body,
      wherein the length extension direction of each of the bump wirings intersects the length extension direction of the one elastic support body.

13. A display device comprising:
   a display panel driven to display an image, the display panel comprising a substrate, the substrate comprising a display area at which the image is displayed;

a terminal pad on the substrate and through which a driving signal is applied to the display area;

a driving chip through which the driving signal is applied to the terminal pad; and a non-conductive film which fixes the driving chip to the substrate, wherein the driving chip comprises a bump provided in plurality arranged on a rear surface portion of the driving chip in a row direction and in a column direction which crosses the row direction, the bump comprises:
  an elastic support body lengthwise extending in a first direction;
  a bump wiring extending in a second direction which intersects the first direction, the bump wiring disposed on the elastic support body; and
  a dispersed particle on the elastic support body, and the plurality of bumps of the driving chip comprises:
  a first bump comprising a plurality of bump wirings on a first elastic support body, and
  a second bump comprising a plurality of bump wirings on a second elastic support body different from the first elastic support body,
  wherein a number of the plurality of bump wirings of the second bump is different from a number of the plurality of bump wirings of the first bump.

14. The display device as claimed in claim 13, wherein the plurality of bumps are arranged in a matrix.

15. The display device as claimed in claim 13, wherein the plurality of bumps are arranged in a zigzag manner along the row direction or the column direction.

16. The display device as claimed in claim 13, wherein the first bump and the second bump are disposed adjacent to one another in the row direction or the column direction.

17. The display device as claimed in claim 13, wherein the dispersed particle has a particle diameter less than a height of the elastic support body.

18. The display device as claimed in claim 17, wherein the dispersed particle is disposed at a first portion of the bump wiring, a second portion of the bump wiring being adjacent to the first portion thereof.

19. The display device as claimed in claim 18, wherein the first portion of the bump wiring at the dispersed particle protrudes further from the elastic support body than the second portion of the bump wiring adjacent to the first portion thereof.

* * * * *